(12) United States Patent
Tada et al.

(10) Patent No.: US 8,268,660 B2
(45) Date of Patent: Sep. 18, 2012

(54) PROCESS FOR FABRICATING MICROMACHINE

(75) Inventors: Masahiro Tada, Kanagawa (JP); Takashi Kinoshita, Kanagawa (JP); Masahiro Tanaka, Kanagawa (JP); Masanari Yamaguchi, Kanagawa (JP); Shun Mitarai, Kanagawa (JP); Koji Naniwada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/551,271

(22) PCT Filed: Apr. 2, 2004

(86) PCT No.: PCT/JP2004/004822
§ 371 (c)(1),
(2), (4) Date: Sep. 28, 2005

(87) PCT Pub. No.: WO2004/089812
PCT Pub. Date: Oct. 21, 2004

(65) Prior Publication Data
US 2006/0216847 A1    Sep. 28, 2006

(30) Foreign Application Priority Data

Apr. 2, 2003  (JP) .................. P2003-098782
Mar. 11, 2004 (JP) .................. 2004-068325

(51) Int. Cl.
*H01L 21/00* (2006.01)
(52) U.S. Cl. .............. 438/48; 438/52; 438/53
(58) Field of Classification Search ........ 438/48–57
See application file for complete search history.

(56) References Cited

U.S. PATENT DOCUMENTS

| | | | | |
|---|---|---|---|---|
| 4,262,399 A | * | 4/1981 | Cady | 438/53 |
| 4,838,088 A | * | 6/1989 | Murakami | 73/724 |
| 5,589,082 A | * | 12/1996 | Lin et al. | 216/2 |
| 6,448,604 B1 | * | 9/2002 | Funk et al. | 257/312 |
| 6,621,134 B1 | * | 9/2003 | Zurn | 257/415 |
| 6,635,509 B1 | * | 10/2003 | Ouellet | 438/106 |
| 6,704,185 B2 | * | 3/2004 | Chatzandroulis et al. | 361/283.1 |
| 6,761,068 B1 | * | 7/2004 | Schmid | 73/504.14 |
| 7,008,812 B1 | * | 3/2006 | Carley | 438/52 |
| 2002/0131228 A1 | * | 9/2002 | Potter | 361/233 |
| 2005/0221528 A1 | * | 10/2005 | Bruner | 438/50 |

FOREIGN PATENT DOCUMENTS

JP    06-46207    2/1994

(Continued)

OTHER PUBLICATIONS

Wolf et al. vol. 1, pp. 331-332, Silicon Processing for the VLSI ERA, 1986, Lattice Press.*

(Continued)

*Primary Examiner* — H. Jey Tsai
(74) *Attorney, Agent, or Firm* — SNR Denton US LLP

(57) ABSTRACT

A method for manufacturing a micromachine is provided which can remove a sacrifice layer and can perform sealing without using a specific packaging technique. In a method for manufacturing a micromachine (1) including an oscillator (4), a step of forming a sacrifice layer around a movable portion of the oscillator (4); a step of covering a sacrifice layer with an overcoat film (8), followed by the formation of a penetrating hole (10) reaching the sacrifice layer in the overcoat layer (8); a step of performing sacrifice-layer etching for removing the sacrifice layer using the penetrating hole (10) in order to form a space around the movable portion; and a step of performing a film-formation treatment at a reduced pressure following the sacrifice-layer etching so as to seal the penetrating hole (10).

4 Claims, 4 Drawing Sheets

FOREIGN PATENT DOCUMENTS

| | | |
|---|---|---|
| JP | 07-131280 | 5/1995 |
| JP | 09-148467 | 6/1997 |
| JP | 2004-085547 | 3/2004 |
| WO | WO2004/061983 | 7/2004 |

OTHER PUBLICATIONS

Japanese Office Action dated Aug. 5, 2008 for Application No. 2004-068325.

* cited by examiner

PROCESS FOR FABRICATING MICROMACHINE

TECHNICAL FIELD

The present invention relates to a method for manufacturing a micromachine including an oscillator.

BACKGROUND ART

In recent years, concomitant with the advancement of techniques for manufacturing microstructures on substrates, so-called micromachines (Micro Electro-Mechanical Systems, hereinafter referred to as "MEMS") and compact apparatuses incorporating MEMSs have drawn attentions. The MEMS is a device composed of an oscillator, which is a movable structural element, and a semiconductor integrated circuit or the like which controls the drive of the oscillator and which is electrically and mechanically coupled therewith. In addition, the oscillator is incorporated in part of the device, and the drive of the oscillator is electrically performed using the Coulomb force or the like between electrodes.

Of the MEMSs as described above, in particular, devices formed using a semiconductor process have the following various features. That is, for example, the devices each require a small area, can realize a high Q value (quality indicating the sharpness of resonance of an oscillation system), and can be integrated with another semiconductor device (integration); hence, the use as a high-frequency filter for wireless communication has been proposed (for example, see C. T.-C. Nguyen, "Micromechanical components for miniaturized low-power communications (invited plenary)," proceedings 1999 IEEE MTT-S International Microwave Symposium RF MEMS Workshop, Jun. 18, 1999, pp. 48-77).

Incidentally, when a MEMS is integrated with another semiconductor device, the structure has been proposed in which encapsulation is performed for the oscillator, which is a part of the MEMS, so that a wiring layer or the like is further provided above the oscillator (for example, see Japanese Unexamined Patent Application Publication No. 2002-94328 (p. 7 and FIG. 10)). However, when the oscillator is encapsulated, a hollow structure must be formed around the oscillator, that is, it is required that a space around a movable portion of the oscillator is ensured so as to place the oscillator in a movable state. For ensuring the space around the movable portion described above, in general, so-called sacrifice-layer etching is performed.

The sacrifice-layer etching is etching in which a thin film is formed beforehand around the movable portion of the oscillator and is then removed by etching so as to form the space (gap) around the movable portion. In addition, the thin film formed around the movable portion for sacrifice-layer etching is called a sacrifice layer.

However, the integration of the MEMS with another semiconductor device has various problems. In general, for this integration, a process for manufacturing the MEMS (particularly, the oscillator thereof) is performed in a final step which is added to a manufacturing process (such as a CMOS process) of said another semiconductor. Accordingly, in the process for manufacturing the MEMS, in order to avoid adverse influences on the semiconductor device which is already formed, a high-temperature process cannot be performed. That is, the oscillator must be formed at a low temperature, and as a result, the process therefor may not be easily performed in some cases.

On the other hand, when the part of the MEMS, that is, the oscillator, is encapsulated, a wiring layer or the like may be further formed thereabove, and as a result, even though the oscillator is formed at a high temperature, an adverse influence of the high-temperature process on the wiring layer or the like can be avoided. However, in the case described above, since the space around the movable portion of the oscillator formed by sacrifice-layer etching is vacuum-sealed, a specific packaging technique using an insulating material or the like is required (for example, see Japanese Unexamined Patent Application Publication No. 2002-94328 (p. 7 and FIG. 10). That is, since a packaging step for vacuum sealing is required, manufacturing cannot be easily performed using the existing semiconductor process (such as a CMOS process), and as a result, the production efficiency of a device including the MEMS may be decreased in some cases.

Accordingly, an object of the present invention is to provided a method for manufacturing a micromachine, in which the oscillator, which is the part of the MEMS, is sealed using sacrifice-layer etching in order to achieve easier formation of the MEMS, and in which even in the case described above, removal of a sacrifice layer and sealing can be performed without using any specific packaging technique.

DISCLOSURE OF INVENTION

The present invention provides a method for manufacturing a MEMS including an oscillator in order to achieve the object described above. The method described above comprises a step of forming a sacrifice layer around a movable portion of the oscillator; a step of covering a sacrifice layer with an overcoat film, followed by the formation of a penetrating hole in the overcoat layer which reaches the sacrifice layer; a step of performing sacrifice-layer etching for removing the sacrifice layer using the penetrating hole in order to form a space around the movable portion; and a step of performing a film-formation treatment at a reduced pressure so as to seal the penetrating hole following the sacrifice-layer etching.

According to the manufacturing method of a MEMS, which has the procedure described above, since the step of forming a sacrifice layer, the step of covering the sacrifice layer with an overcoat film, and the step of performing sacrifice-layer etching are performed, a wiring layer or the like can be further formed above the overcoat film. That is, after the steps described above, a step of forming a wiring layer or the like may be performed. Hence, when the oscillator is formed in a previous step (such as a step prior to an aluminum step of a CMOS process), although the oscillator is formed at a high temperature, the high temperature process will not adversely influence on a wiring layer or the like.

In addition, since the step of performing a film-formation treatment at a reduced pressure is performed so as to seal the penetrating hole, in this step, the space around the movable portion of the oscillator is sealed in an evacuated state. Furthermore, since the penetrating hole is sealed in the film-formation treatment at a reduced pressure, a film-formation technique of a semiconductor process (such as a CMOS process) can be used as it is. Accordingly, the film-formation step can be continuously performed in conjunction with other steps of the semiconductor process, and in addition, a specific packaging technique for vacuum sealing is not required.

According to the method for manufacturing a MEMS of the present invention, since the oscillator, which is the part of the MEMS, is sealed, even when the oscillator is formed at a high temperature, adverse influence thereof on a wiring layer or the like can be avoided, and as a result, easier formation of a MEMS can be achieved. Furthermore, since the sealing of the space formed by the sacrifice-layer etching is performed by the film-formation treatment at a reduced pressure, without using any specific packaging technique, the removal of the sacrifice layer and the sealing can be performed. Hence, according to the present invention, even when a MEMS is integrated with another semiconductor device, the production efficiency of the device including the MEMS can be improved.

BRIEF DESCRIPTION OF THE DRAWINGS

FIG. 1A is a plan view; FIG. 1B is a front view.

FIGS. 2A to 2D are showing respective steps.

FIGS. 3A to 3D are showing respective steps.

BEST MODE FOR CARRYING OUT THE INVENTION

Hereinafter, with reference to figures, a method for manufacturing a MEMS according to the present invention will be described. However, it is to be naturally understood that the following embodiments which are to be described are merely preferable detailed examples of the present invention, and that the present invention is not limited thereto.

Figure 1A:
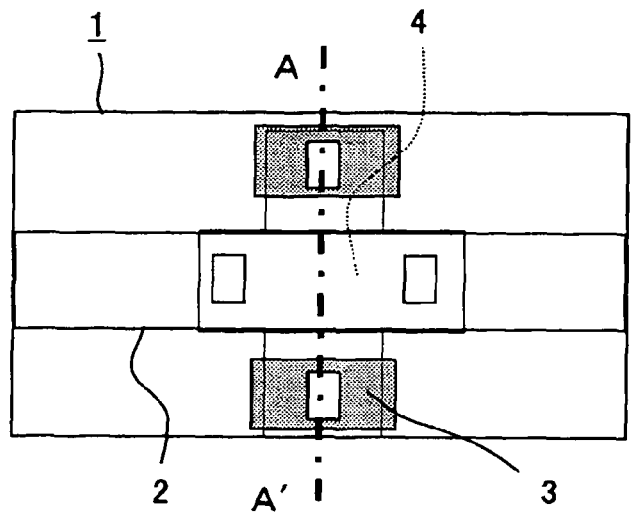
FIGS. 1A and 1B are views illustrating one example of the structure of a MEMS obtained by the present invention.
Figure 1B:
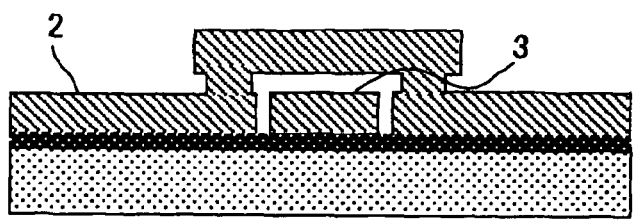
Figure 1C:
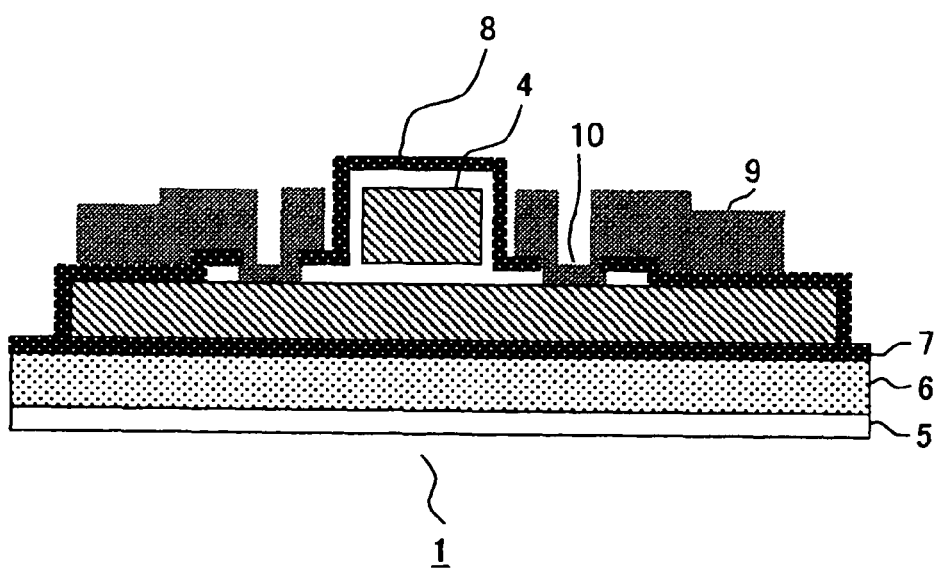
FIG. 1C is a cross-sectional view taken along A-A' in FIG. 1A.

Prior to the description of the method for manufacturing a MEMS, a schematic structure of the MEMS will be described. In this embodiment, a MEMS used as a high-frequency filter for wireless communication will be described by way of example. FIGS. 1A to 1C are views illustrating one example of the structure of a MEMS obtained by the present invention.

As shown in FIG. 1A, in addition to an input electrode 2 and an output electrode 3, a MEMS 1 which will be described has a belt-shaped beam type oscillator (hereinafter simply referred to as "oscillator") 4 formed of a conductive material such as polycrystalline silicon (Poly-Si) containing phosphorus. When a voltage having a specific frequency is applied to the input electrode 2, a beam portion (movable portion) of the oscillator 4 oscillates at its natural oscillation frequency, and the capacitance of a capacitor, which is formed of a space between the output electrode 3 and the movable portion of the oscillator 4, is changed and is then output from the output electrode 3. Hence, when the MEMS 1 is used as a high-frequency filter, compared to a high-frequency filter using a surface acoustic wave (SAW) or a thin film acoustic wave (FBAR), a high Q vale can be realized.

The input electrode 2, the output electrode 3, and the oscillator 4, which constitute the MEMS 1, are all formed as shown in FIG. 1C over the structure composed, for example, of a SiN (silicon nitride) film 7, a $SiO_2$ film 6, and a semiconductor substrate (hereinafter referred to as "Si substrate") 5 formed of Si (single crystal silicon), provided in that order from the top side. Since being formed over the Si substrate 5, the MEMS 1 can be integrated with another semiconductor device.

In the MEMS 1, since the movable portion of the oscillator 4 oscillates at the natural oscillation frequency thereof, the space around the movable portion of the oscillator 4 is ensured. However, since the movable portion of the oscillator 4 is covered with an overcoat film 8 as described later, the space is ensured in the vertical and the horizontal directions of the cross-section of the movable portion, that is, is ensured all around the cross-section thereof.

In addition, at the upper side of the oscillator 4, in order to seal the movable portion of the oscillator 4 by covering, the overcoat film 8 composed, for example, of a SiN film is formed. By the presence of this overcoat film 8, in the MEMS 1, while being placed in a movable state, the oscillator 4 is sealed, and as a result, a wiring layer or the like can also be further provided above the overcoat film 8. By this structure, it is said that the MEMS 1 is a device which can be suitably integrated with another semiconductor device.

In this embodiment, on part of the upper surface of the overcoat film 8, a sputter film 9 composed, for example, of an Al—Cu (aluminum-copper) film or an Al—Si (aluminum-silicon) film is formed. This sputter film 9 is provided for sealing the penetrating holes 10 which are provided in the overcoat film 8 for sacrifice-layer etching in order to ensure the space around the movable portion of the oscillator 4.

Next, a method for manufacturing the MEMS 1 described above, that is, a method for manufacturing a MEMS, according to the present invention, will be described. FIGS. 2A to 3D are views illustrating one procedure of a method for manufacturing a MEMS according to the present invention.

Figure 2A:
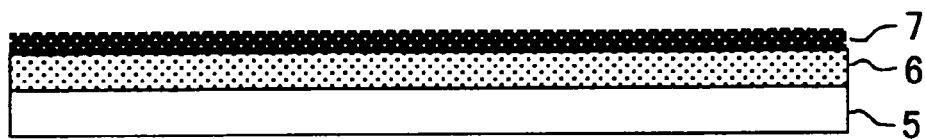
FIGS. 2A to 2D are views (part 1) illustrating one procedure of a method for manufacturing a MEMS according to the present invention.
Figure 2B:
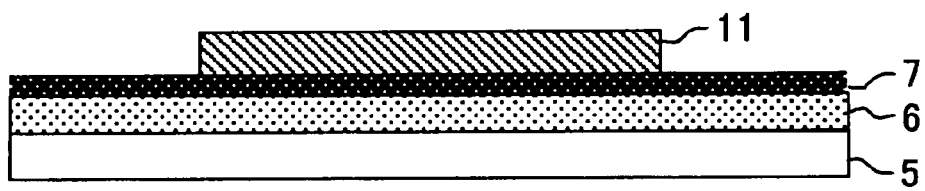

When the MEMS 1 having the structure described above is formed, first, as shown in FIG. 2A, the $SiO_2$ film 6 and the SiN film 7, each functioning as an insulating film, are formed on the Si substrate 5 by a reduced pressure CVD (chemical vapor deposition) method. In addition, on the surface of the above film, as shown in FIG. 2B, a film is formed using a selectively etchable material such as polycrystalline silicon (Poly-Si) containing phosphorus (P), and subsequently, by using known lithographic and dry etching techniques, a lower wire 11 is formed by patterning.

Figure 2C:
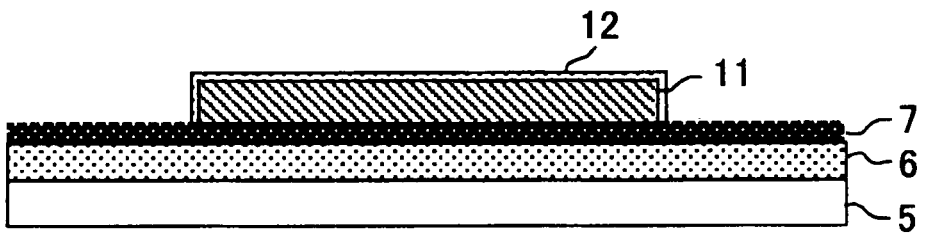

After the lower wire 11 is formed by patterning, as shown in FIG. 2C, a $SiO_2$ film is formed, for example, by a reduced pressure CVD method and is then patterned by known lithographic and dry etching techniques, so that the lower wire 11 is covered with a $SiO_2$ film 12. This $SiO_2$ film 12 functions as a sacrifice layer as described later.

Figure 2D:
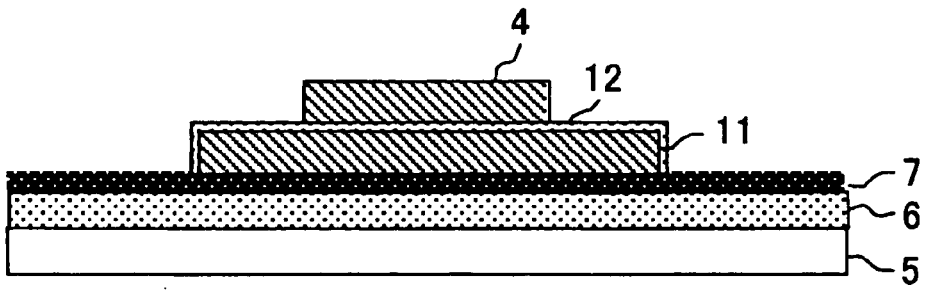

Next, as shown in FIG. 2D, on the $SiO_2$ film 12, a Poly-Si film is formed, for example, by a reduced pressure CVD method and is then patterned by using known lithographic and dry etching techniques, so that the belt-shaped oscillator 4 made of Poly Si is formed.

Figure 3A:
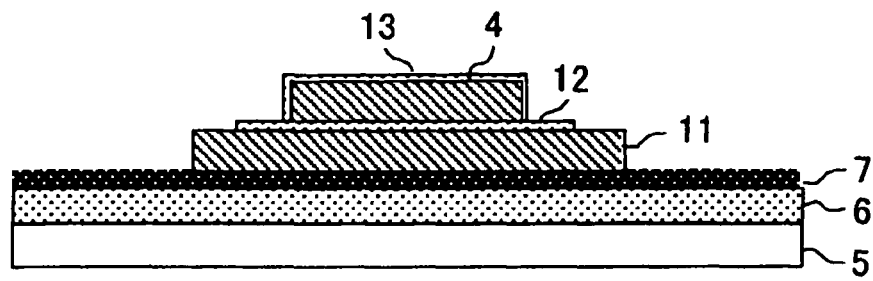
FIGS. 3A to 3D are views (part 2) illustrating one procedure of a method for manufacturing a MEMS according to the present invention.

After the oscillator 4 is formed, subsequently, as shown in FIG. 3A, a $SiO_2$ film is formed, for example, by a reduced pressure CVD method and is then patterned by using known lithographic and dry etching techniques, so that the oscillator 4 is covered with a $SiO_2$ film 13. This $SiO_2$ film 13 also functions as a sacrifice layer. Accordingly, the periphery of the movable portion of the oscillator 4, that is, all the surfaces including side surfaces of the cross section of the oscillator 4 in the vertical and horizontal directions are covered with the $SiO_2$ film 12 and the $SiO_2$ film 13. That is, in the lower direction of the cross section of the oscillator 4, the $SiO_2$ film 12 is present, and in the horizontal direction and the upper direction of the cross section of the oscillator 4, the $SiO_2$ film 13 is present.

Figure 3B:
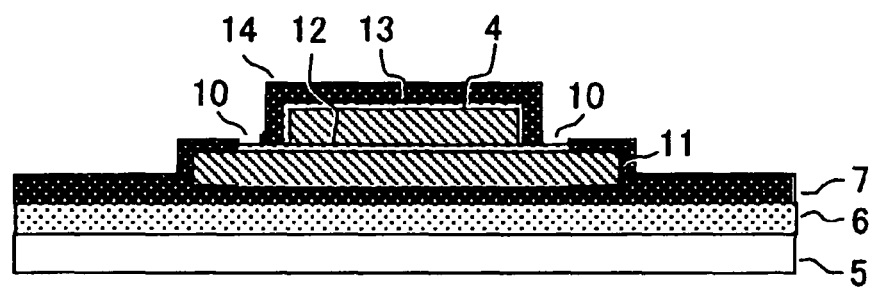

As described above, after the $SiO_2$ film 12 and the $SiO_2$ film 13, each functioning as a sacrifice layer, are formed, as shown in FIG. 3B, on the surfaces thereof, a SiN film 14 is formed, for example, by a reduced pressure CVD method. This SiN film 14 functions as an overcoat film covering the sacrifice layers. In addition, in this SiN film 14, the penetrating holes 10 reaching the sacrifice layer (one of the SiO$_2$ film 12 and the SiO$_2$ film 13) are formed by known lithographic and dry etching techniques.

Figure 3C:
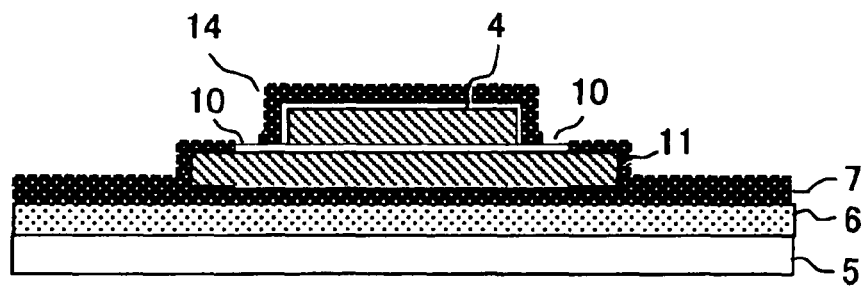

After forming the penetrating holes 10, sacrifice-layer etching for removing the sacrifice layers is performed using the penetrating holes 10, so that the space is formed around the movable portion of the oscillator 4. That is, as shown in FIG. 3C, using a solution, which selectively removes SiO$_2$, such as an aqueous hydrofluoric acid solution (DHF solution), the SiO$_2$ film 12 and the SiO$_2$ film 13 are removed. Accordingly, around the movable portion of the oscillator 4, that is, along the entire periphery of the cross-section of the movable portion, a space (gap) corresponding to the thickness of the sacrifice layer is formed, and hence the movable portion of the oscillator 4 is allowed to oscillate at the natural oscillation frequency.

Figure 3D:
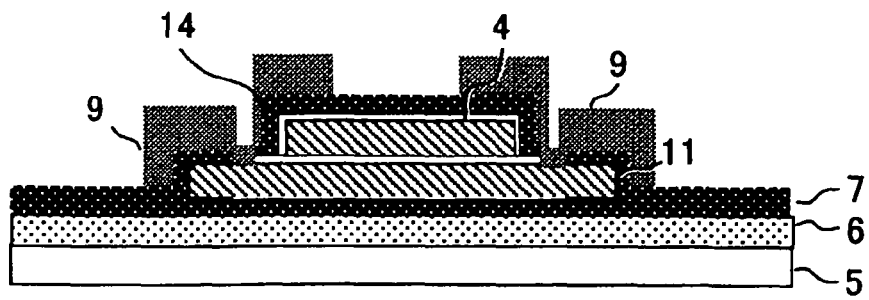

After the sacrifice-layer etching, a film-formation treatment which is the most characteristic step in this embodiment is performed at a reduced pressure. In particular, for example, a film-formation treatment by sputtering is performed in an evacuated state, and as shown in FIG. 3D, the sputter film 9 is formed for sealing the penetrating holes 10. Since the film-formation treatment is executed by sputtering, as a reactant gas used in this step, for example, an argon (Ar) gas, which is an inert gas, may be mentioned. In addition, as the sputter film 9, for example, a thin film of a metal or a metal compound, such as an Al—Cu film or an Al—Si film, may be mentioned. Subsequently, after being formed, the sputter film 9 is patterned into wires or the like by using known lithographic and dry etching techniques.

Through the procedure (respective steps) as described above, the MEMS 1 shown in FIGS. 1A to 1C is formed. However, the manufacturing method performed by the above procedure is not only applied to the MEMS 1 having the structure shown in FIGS. 1A to 1C but may also be applied to a MEMS having a different structure as long as the MEMS is formed by sacrifice-layer etching which is performed using a penetrating hole provided in an overcoat film.

Figure 4:
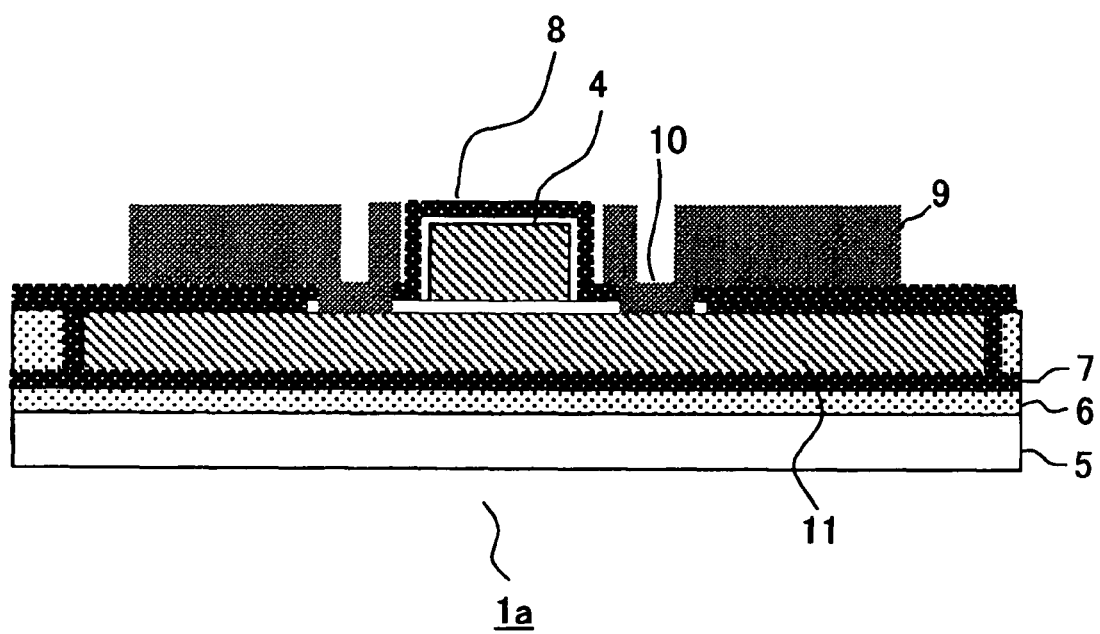
FIG. 4 is a view illustrating another example of the structure of a MEMS obtained by the present invention.

FIG. 4 is a view illustrating another example of the structural of a MEMS obtained by the present invention. Since the lower wire 11 is buried, a MEMS 1a shown in the figure is different from the MEMS 1 shown in FIGS. 1A to 1C; however, the MEMS 1a described above can even be manufactured by a procedure (respective steps) similar to that for the above MEMS 1. That is, it is considered that the penetrating holes 10 provided in the overcoat film 8 for sacrifice-layer etching can be sealed by a film-formation treatment using sputtering.

In addition, in both the MEMS 1 and the MEMS 1a shown in FIGS. 1A to 1C and 4, the case in which the oscillator 4 is a belt-shaped beam type is described by way of example; however, even in the case of a so-called ring type oscillator or disc type oscillator, as long as a hollow structure is used in which a space for a movable portion is ensured therearound, the manufacturing method according to above procedure can be applied in the exactly same manner as that described above. Furthermore, as means for driving oscillation in the oscillator, the case in which static electricity is used is described in the above example; however, the means is not always limited to the electrostatic drive, and for example, it may be applied to a piezoelectric driven FBAR in the exactly same manner as described above.

As described above, according to the method for manufacturing a MEMS described in this embodiment, since there are provided the steps of forming the SiO$_2$ film 12 and the SiO$_2$ film 13 functioning as a sacrifice layer around the oscillator 4, the step of covering the sacrifice layers with the SiN film 14 which is the overcoat film, and the step of performing the sacrifice-layer etching, a wiring layer or the like can be further disposed above this SiN film 14. That is, after the steps described above, a step of forming a wiring layer or the like can be performed. Hence, by forming the oscillator 4 in a step prior to the above step, the oscillator 4 can be formed at a position lower than that of a metal wiring layer or the like. As a result, even when the oscillator 4 is formed at a high temperature, the high-temperature process will not adversely influence the wiring layer or the like, and hence the easier formation of the oscillator 4 can be achieved.

Furthermore, according to the method for manufacturing a MEMS described in this embodiment, since the step of sealing the penetrating holes 10 by the film-formation using sputtering is performed following the sacrifice-layer etching, the space around the movable portion of the oscillator 4 can be sealed in the step described above. Hence, a specific packaging technique using an insulating material or the like is not required. That is, without performing a packaging step for a vacuum sealing, the space formed by the sacrifice-layer etching around the movable portion of the oscillator 4 can be sealed.

In addition, it may also be considered that the sputter film 9 used for sealing is to be used as wires or the like. That is, it may also be considered that by using the sputter film 9 for forming wires or the like, the penetrating holes 10 are sealed; hence, in the case described above, the sealing and the formation of wires or the like are realized in the same step, and as a result, the improvement in efficiency of the manufacturing process can be very effectively realized.

Furthermore, since the penetrating holes 10 are sealed by the film-formation treatment using sputtering, a film-formation technique of a semiconductor process (such as a CMOS process) can be used as it is and, in addition, the technique described above can be continuously performed in conjunction with other steps of the above semiconductor process. That is, sealing can be performed in a so-called in-line process. As a result, integration with a CMOS process or the like can be very easily performed, and in addition to that, MEMS evaluation in a wafer state can also be performed.

As has thus been described, when a MEMS is formed by the manufacturing method described in this embodiment, even when the MEMS is integrated with another semiconductor device, the manufacturing of the MEMS can be performed in an existing semiconductor process (such as a CMOS process), and as a result, the production efficiency of the device including the MEMS can be improved.

In particular, as described in this embodiment, when being performed by the film-formation treatment using sputtering, the sealing is executed in an argon gas which is an inert gas, and hence it is very preferable in terms of safety and reliability.

The invention claimed is:

1. A method for manufacturing a micromachine, comprising the steps of:
    providing a substrate;
    forming an insulating layer on the substrate;
    forming a lower wire on the insulating layer;
    forming a first sacrifice layer comprising silicon dioxide on a top surface of the lower wire;
    forming an oscillator on a portion of the first sacrifice layer;
    forming a second sacrifice layer on top and side surfaces of the oscillator so that a movable portion of the oscillator is covered with the second sacrifice layer, the second sacrifice layer comprising silicon dioxide, and in cross-section, the movable portion of the oscillator is surrounded by the first and second sacrifice layers;

covering exposed portions of the first and second sacrifice layers with an overcoat film;

forming first and second penetrating holes in the overcoat film respectively on both sides of the oscillator, the first and second penetrating holes extending through the overcoat film to reach the first sacrificial layer on the both sides of the oscillator, performing sacrifice-layer etching using the first and second penetrating holes to remove the first and second sacrifice layers so as to form a space around the movable portion of the oscillator; and following the sacrifice-layer etching, performing a film-formation treatment by sputtering at a reduced pressure so as to form a sputtering layer that seals the first and second penetrating holes and that is formed into at least one upper wire over the overcoat film, wherein,
the sputtering layer is composed of one selected from the group consisting of an aluminum copper film and an aluminum silicon film.

2. The method for manufacturing a micromachine, according to claim 1, wherein the method is applied to a micromachine having means for driving oscillation in the oscillator.

3. The method for manufacturing a micromachine, according to claim 2, wherein static electricity is used as the means for driving oscillation.

4. The method for manufacturing a micromachine, according to claim 2, wherein piezoelectricity is used as the means for driving oscillation.

* * * * *